(12) United States Patent
Tahara et al.

(10) Patent No.: US 12,273,079 B2
(45) Date of Patent: Apr. 8, 2025

(54) POWER AMPLIFIER CIRCUIT, HIGH FREQUENCY CIRCUIT, AND COMMUNICATION APPARATUS

(71) Applicant: MURATA MANUFACTURING CO., LTD., Kyoto (JP)

(72) Inventors: Kenji Tahara, Kyoto (JP); Kenichi Shimamoto, Kyoto (JP); Yusuke Tanaka, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 496 days.

(21) Appl. No.: 17/805,259

(22) Filed: Jun. 3, 2022

(65) Prior Publication Data

US 2022/0294401 A1    Sep. 15, 2022

Related U.S. Application Data

(63) Continuation of application No. PCT/JP2020/031128, filed on Aug. 18, 2020.

(30) Foreign Application Priority Data

Dec. 24, 2019    (JP) .................................. 2019-232950

(51) Int. Cl.
  *H03F 1/07*    (2006.01)
  *H03F 1/02*    (2006.01)
  *H03F 3/195*   (2006.01)
  *H03F 3/24*    (2006.01)

(52) U.S. Cl.
  CPC ........... *H03F 3/245* (2013.01); *H03F 1/0222* (2013.01); *H03F 3/195* (2013.01)

(58) Field of Classification Search
  CPC ................. H03F 1/07; H03F 1/02; H03F 1/30

USPC ............................. 330/295, 124 R, 296, 285
See application file for complete search history.

(56) References Cited

U.S. PATENT DOCUMENTS

| 4,665,547 A  | * | 5/1987 | Tuhy, Jr. ............. | H04M 19/005 |
| | | | | 327/309 |
| 6,566,954 B2 | * | 5/2003 | Miyazawa ............... | H03F 1/302 |
| | | | | 330/296 |
| 2019/0305736 A1 | | 10/2019 | Tahara et al. | |

FOREIGN PATENT DOCUMENTS

JP    2019-176454 A    10/2019

OTHER PUBLICATIONS

International Search Report for PCT/JP2020/031128 dated Nov. 17, 2020.

* cited by examiner

*Primary Examiner* — Henry Choe
(74) *Attorney, Agent, or Firm* — MCDONALD HOPKINS LLC

(57) ABSTRACT

Increase in power-added efficiency can be achieved. A second base of a second transistor is connected to a first collector of a first transistor. A third base of a third transistor is connected to the first collector of the first transistor, and a third collector of the third transistor is connected to a second collector of the second transistor. A second bias circuit includes a fifth transistor connected to the second base of the second transistor. A third bias circuit includes a sixth transistor connected to the third base of the third transistor. A first current limiting circuit includes a seventh transistor, a first collector resistor, and a first base resistor. A second current limiting circuit includes an eighth transistor, a second collector resistor, and a second base resistor.

11 Claims, 6 Drawing Sheets

POWER AMPLIFIER CIRCUIT, HIGH FREQUENCY CIRCUIT, AND COMMUNICATION APPARATUS

CROSS REFERENCE TO RELATED APPLICATION

This is a continuation of International Application No. PCT/JP2020/031128 filed on Aug. 18, 2020 which claims priority from Japanese Patent Application No. 2019-232950 filed on Dec. 24, 2019. The contents of these applications are incorporated herein by reference in their entireties.

BACKGROUND ART

Technical Field

The present disclosure generally relates to a power amplifier circuit, a high frequency circuit, and a communication apparatus, and more particularly, to a power amplifier circuit that amplifies power of a high frequency signal, a high frequency circuit that includes the power amplifier circuit, and a communication apparatus that includes the high frequency circuit.

Power amplifier circuits including a first amplifying transistor, a second amplifying transistor, a first variable voltage power source, a second variable voltage power source, a first bias circuit, a second bias circuit, and a current limiting circuit have been known (see, for example, Patent Document 1).

The first amplifying transistor includes a base terminal, a collector terminal, and an emitter terminal and is a first-stage (drive-stage) amplifying transistor that amplifies the power of a high frequency signal input through the base terminal and outputs the power-amplified high frequency signal through the collector terminal. The second amplifying transistor includes a base terminal, a collector terminal, and an emitter terminal and is a second-stage (power-stage) amplifying transistor that amplifies the power of a high frequency signal input through the base terminal and outputs the power-amplified high frequency signal through the collector terminal. The first variable voltage power source supplies a first variable voltage to the collector terminal of the first amplifying transistor. The second variable voltage power source supplies a second variable voltage to the collector terminal of the second amplifying transistor. The first bias circuit outputs a DC bias current to the base terminal of the first amplifying transistor. The second bias circuit outputs a DC bias current to the base terminal of the second amplifying transistor. The current limiting circuit limits the DC bias current output from the second bias circuit to the base terminal of the second amplifying transistor.

In the power amplifier circuit described in Patent Document 1, regarding the static characteristics (DC characteristics) between the second variable voltage and the collector current in the case where the voltage between the base and the emitter of the second amplifying transistor is varied, the collector current decreases as the second variable voltage decreases. This is because in the power amplifier circuit described in Patent Document 1, in accordance with a decrease in the second variable voltage, the current limiting circuit limits (reduces) the DC bias current output from the second bias circuit. That is, in the power amplifier circuit described in Patent Document 1, for example, when the second variable voltage is reduced in association with the power amplitude of a high frequency signal by using an envelope tracking (ET) method, the DC bias current supplied from the second bias circuit to the base terminal of the second amplifying transistor is limited and reduced by the current limiting circuit. Thus, in the power amplifier circuit described in Patent Document 1, the collector current flowing depending on the DC bias current also decreases in accordance with the decrease in the second variable voltage.

Patent Document 1: Japanese Unexamined Patent Application Publication No. 2019-176454

BRIEF SUMMARY

In the power amplifier circuit described in Patent Document 1, for example, compared to the power-added efficiency during an operation with a high output power (for example, 22 dBm), the power-added efficiency during an operation with a medium output power (for example, 16 dBm) may decrease.

The present disclosure provides a power amplifier circuit, a high frequency circuit, and a communication apparatus that are capable of increasing power-added efficiency.

A power amplifier circuit according to an aspect of the present disclosure amplifies power of a high frequency signal. The power amplifier circuit includes a first transistor, a second transistor, a third transistor, a first bias circuit, a second bias circuit, a third bias circuit, a first current limiting circuit, and a second current limiting circuit. The first transistor includes a first base, a first collector, and a first emitter. The second transistor includes a second base, a second collector, and a second emitter. The second base of the second transistor is connected to the first collector. The third transistor includes a third base, a third collector, and a third emitter. The third base of the third transistor is connected to the first collector. The third collector of the third transistor is connected to the second collector. The first bias circuit includes a fourth transistor connected to the first base. The second bias circuit includes a fifth transistor connected to the second base. The third bias circuit includes a sixth transistor connected to the third base. The fourth transistor includes a fourth base, a fourth collector, and a fourth emitter. The fifth transistor includes a fifth base, a fifth collector, and a fifth emitter. The sixth transistor includes a sixth base, a sixth collector, and a sixth emitter. The first current limiting circuit includes a seventh transistor, a first collector resistor, and a first base resistor. The seventh transistor includes a seventh base, a seventh collector, and a seventh emitter. The seventh emitter of the seventh transistor is connected to the fifth emitter. The first collector resistor includes a first end and a second end. The first end of the first collector resistor is connected to the seventh collector. The second end of the first collector resistor is connected to the first collector. The first base resistor includes a first end and a second end. The first end of the first base resistor is connected to the seventh base. The second end of the first base resistor is connected to the fifth base. The second current limiting circuit includes an eighth transistor, a second collector resistor, and a second base resistor. The eighth transistor includes an eighth base, an eighth collector, and an eighth emitter. The eight emitter of the eighth transistor is connected to the sixth emitter. The second collector resistor includes a first end and a second end. The first end of the second collector resistor is connected to the eighth collector. The second end of the second collector resistor is connected to the first collector. The second base resistor includes a first end and a second end. The first end of the second base resistor is connected to the eighth base. The second end of the second base resistor is connected to the sixth base. The power amplifier circuit satisfies at least one of a first condition and a second condition. The first condition is that a resistance of the first base resistor is different from a resistance of the second base resistor. The second condition is that a resistance of the first collector resistor is different from a resistance of the second collector resistor.

A power amplifier circuit according to an aspect of the present disclosure amplifies power of a high frequency signal. The power amplifier circuit includes a first transistor, a second transistor, a third transistor, a first bias circuit, a second bias circuit, and a third bias circuit. The first transistor includes a first base, a first collector, and a first emitter. The first transistor amplifies a high frequency signal input through the first base and outputs the amplified high frequency signal through the first collector. The second transistor includes a second base, a second collector, and a second emitter. The second base of the second transistor is connected to the first collector. The third transistor includes a third base, a third collector, and a third emitter. The third base of the third transistor is connected to the first collector. The third collector of the third transistor is connected to the second collector. The first bias circuit supplies a first bias current to the first base of the first transistor. The second bias circuit supplies a second bias current to the second base of the second transistor. The third bias circuit supplies a third bias current to the third base of the third transistor. In the power amplifier circuit, a gain dispersion obtained in a case where the first bias current is supplied to the first transistor, the second bias current is not supplied to the second transistor, and the third bias current is supplied to the third transistor is greater than a gain dispersion obtained in a case where the first bias current is supplied to the first transistor, the second bias current is supplied to the second transistor, and the third bias current is supplied to the third transistor.

A high frequency circuit according to an aspect of the present disclosure includes the power amplifier circuit according to any one of the aspects mentioned above and a control circuit. The control circuit controls the power amplifier circuit.

A communication apparatus according to an aspect of the present disclosure includes the high frequency circuit and a signal processing circuit. The power amplifier circuit of the high frequency circuit amplifies a high frequency signal input from the signal processing circuit.

In a power amplifier circuit, a high frequency circuit, and a communication apparatus according to an aspect of the present disclosure described above, increase in power-added efficiency can be achieved.

DETAILED DESCRIPTION

Embodiments

Hereinafter, a power amplifier circuit 10 according to an embodiment will be described with reference to FIGS. 1 to 5, 6A, 6B, 7, 8A, and 8B.

Figure 2:
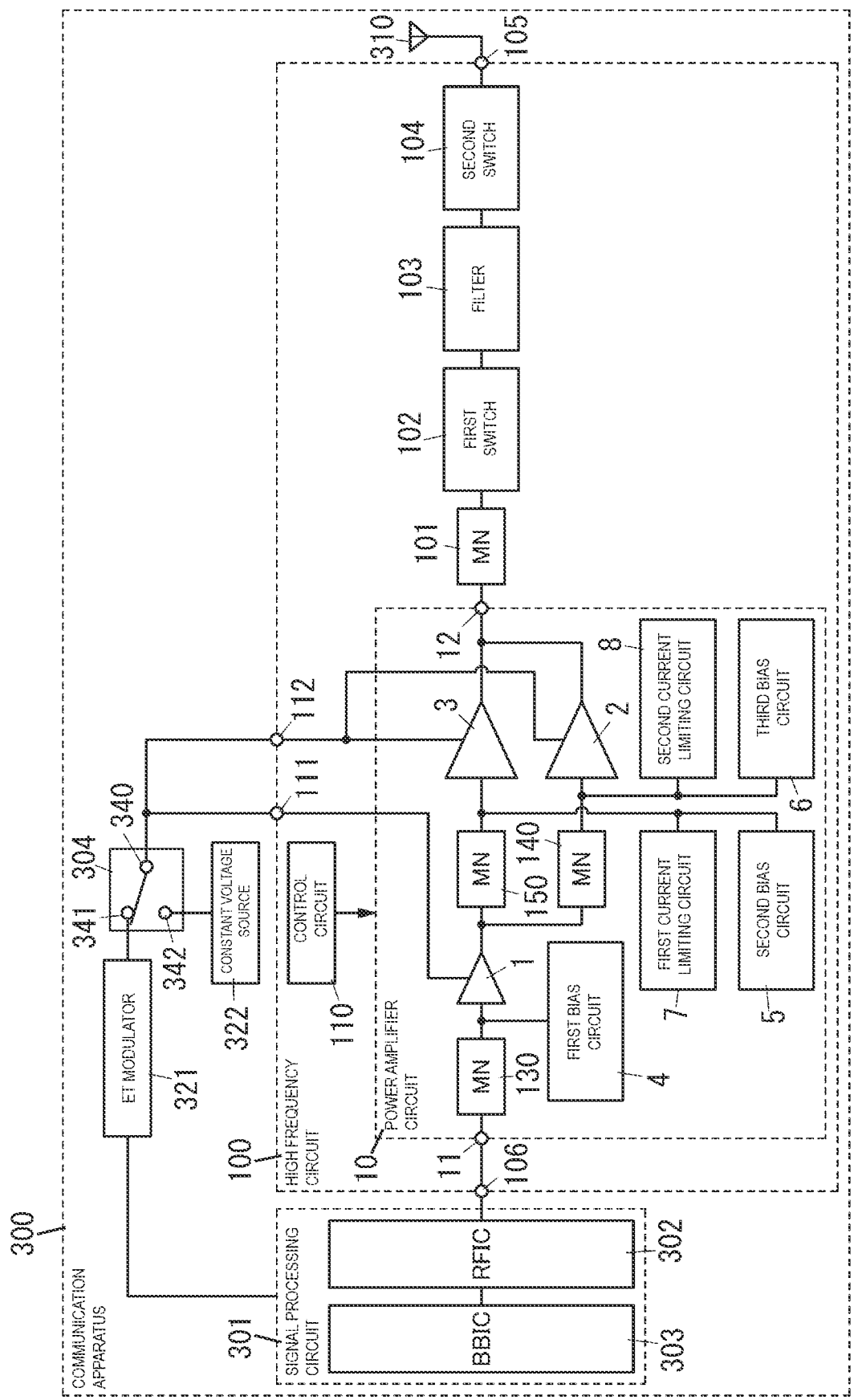
FIG. 2 is a circuit diagram of a communication apparatus including a high frequency circuit including the power amplifier circuit.

(1) Power Amplifier Circuit, High Frequency Circuit, and Communication Apparatus (1.1) Circuit Configuration of High Frequency Circuit Including Power Amplifier Circuit A high frequency circuit 100 (see FIG. 2) including the power amplifier circuit 10 is, for example, used in a communication apparatus 300 (see FIG. 2). The communication apparatus 300 is, for example, a cellular phone (for example, a smartphone). However, the communication apparatus 300 is not limited to a cellular phone and may be, for example, a wearable terminal (for example, a smartwatch). The high frequency circuit 100 is, for example, a circuit that is capable of supporting 4G (fourth generation mobile communication) and 5G (fifth generation mobile communication) standards. The 4G standards are, for example, 3GPP LTE (Long Term Evolution) standards. The 5G standards are, for example, 5G NR (New Radio). The high frequency circuit may be a circuit that is capable of supporting carrier aggregation and dual connectivity.

For example, the high frequency circuit 100 is configured to be capable of amplifying a transmission signal input from a signal processing circuit 301 and outputting the amplified transmission signal to an antenna 310. The signal processing circuit 301 is not a component of the high frequency circuit 100 but is a component of the communication apparatus 300 including the high frequency circuit 100. For example, the high frequency circuit 100 is controlled by the signal processing circuit 301 included in the communication apparatus 300.

The high frequency circuit 100 includes the power amplifier circuit 10, an output matching circuit 101, a first switch 102, a filter 103, a second switch 104, an antenna terminal 105, a signal input terminal 106, a first power supply terminal 111, and a second power supply terminal 112.

The power amplifier circuit 10 includes a first amplifier 1, a second amplifier 2, and a third amplifier 3. For example, the power amplifier circuit 10 amplifies an input signal from the signal processing circuit 301 and outputs the amplified input signal. The input signal is a high frequency signal (transmission signal) of a predetermined frequency band. For example, the predetermined frequency band includes different communication bands.

The output matching circuit 101 is provided at a signal path between the power amplifier circuit 10 and the first switch 102. The output matching circuit 101 is a circuit for achieving impedance matching between the power amplifier circuit 10 and the filter 103. For example, the output matching circuit 101 includes a single inductor. However, the output matching circuit 101 is not necessarily a single inductor but may include a plurality of inductors and a plurality of capacitors.

The first switch 102 is provided between the output matching circuit 101 and the filter 103. The first switch 102 includes a common terminal and a plurality of selection terminals. The common terminal of the first switch 102 is connected to the power amplifier circuit 10 with the output matching circuit 101 interposed therebetween. One of the plurality of selection terminals of the first switch 102 is connected to the filter 103. For example, the first switch 102 is a switch capable of connecting at least one of the plurality of selection terminals to the common terminal. For example, the first switch 102 is a switch capable of one-to-one and one-to-many connections. The first switch 102 is a switch capable of switching between signal paths for transmission signals of different communication bands. The first switch 102 conforms to, for example, MIPI (Mobile Industry Processor Interface) standards. For example, the first switch 102 performs switching of the state of connection between the common terminal and the plurality of selection terminals in accordance with a control signal input from the signal processing circuit 301. For example, the first switch 102 is a switch IC (Integrated Circuit).

The filter 103 is a filter whose pass band is a transmission band of a communication band (for example, Band 3) among the plurality of communication bands. For example, the filter 103 is a one-chip acoustic wave filter, and each of a plurality of series-arm resonators and a plurality of parallel-arm resonators is an acoustic wave resonator. An acoustic wave filter is, for example, a surface acoustic wave filter using surface acoustic waves. In the surface acoustic wave filter, each of a plurality of series-arm resonators and a plurality of parallel-arm resonators is, for example, a SAW (Surface Acoustic Wave) resonator.

The second switch 104 is provided between the filter 103 and the antenna terminal 105. The second switch 104 is a switch connected to the antenna terminal 105. The second switch 104 includes a common terminal and a plurality of selection terminals. In the second switch 104, the common terminal is connected to the antenna terminal 105. The filter 103 is connected to one of the plurality of selection terminals of the second switch 104. The second switch 104 conforms to, for example, MIPI standards. For example, the second switch 104 performs switching of the state of connection between the common terminal and the plurality of selection terminals in accordance with a control signal input from the signal processing circuit 301. For example, the second switch 104 is a switch IC.

The antenna terminal 105 is connected to the antenna 310.

In the high frequency circuit 100, a high frequency signal (transmission signal) output from the power amplifier circuit 10 passes through the output matching circuit 101, the first switch 102, the filter 103, the second switch 104, and the antenna terminal 105 and is then transmitted through the antenna 310.

In the high frequency circuit 100, the first power supply terminal 111 is connected to the first amplifier 1. The second power supply terminal 112 is connected to the second amplifier 2 and the third amplifier 3. An envelope tracking modulator 321 (hereinafter, referred to as an ET modulator 321) and a constant voltage source 322 are selectively connected to the first power supply terminal 111 and the second power supply terminal 112 with a switch 304 interposed therebetween. The ET modulator 321, the constant voltage source 322, and the switch 304 are not components of the high frequency circuit 100 but are components of the communication apparatus 300 including the high frequency circuit 100.

(1.2) Circuit Configuration of Communication Apparatus Including High Frequency Circuit The communication apparatus 300 includes the high frequency circuit 100 and the signal processing circuit 301. The communication apparatus 300 further includes the antenna 310. For example, the signal processing circuit 301 includes an RF signal processing circuit 302 and a baseband signal processing circuit 303. The RF signal processing circuit 302 is, for example, an RFIC (Radio Frequency Integrated Circuit) and performs signal processing on a high frequency signal. For example, the RF signal processing circuit 302 performs signal processing such as up-conversion on a high frequency signal (transmission signal) output from the baseband signal processing circuit 303, and outputs the high frequency signal on which the signal processing has been performed. The baseband signal processing circuit 303 is, for example, a BBIC (Baseband Integrated Circuit). The baseband signal processing circuit 303 generates an I-phase signal and a Q-phase signal from a baseband signal. The baseband signal is, for example, an audio signal, an image signal, or the like input from the outside. The baseband signal processing circuit 303 performs IQ modulation by combining the I-phase signal with the Q-phase signal and outputs a transmission signal. At this time, the transmission signal is generated as a modulation signal (IQ signal), which is obtained by modulating the amplitude of a carrier signal of a predetermined frequency in accordance with a period longer than the period of the carrier signal. The high frequency circuit 100 transfers a high frequency signal (transmission signal) between the antenna 310 and the RF signal processing circuit 302 of the signal processing circuit 301.

Furthermore, the communication apparatus 300 further includes the ET modulator 321, the constant voltage source 322, and the switch 304 as described above.

The ET modulator 321 detects an envelope of a signal output from the baseband signal processing circuit 303. That is, the ET modulator 321 detects a waveform (envelope signal) of the amplitude modulation of a carrier signal forming a transmission signal. Specifically, the ET modulator 321 detects an envelope signal from an I-phase signal and a Q-phase signal.

The ET modulator 321 determines the power supply voltage (first power supply voltage and second power supply voltage) in accordance with the waveform of an envelope signal and a preset amplification factor. The period of the power supply voltage is the same as the period of the envelope signal. The amplitude fluctuation of the power supply voltage is the same as the amplitude fluctuation of the envelope signal. That is, the amplitude characteristics (period and amplitude fluctuation) are the same between the envelope signal and the power supply voltage. The ET modulator 321 outputs the power supply voltage to the first power supply terminal 111 and the second power supply terminal 112.

The switch 304 includes a common terminal 340 connected to both the first power supply terminal 111 and the second power supply terminal 112, a first selection terminal 341 connected to the ET modulator 321, and a second selection terminal 342 connected to the constant voltage source 322. For example, the switch 304 is controlled by the signal processing circuit 301, and at least one of the first selection terminal 341 and the second selection terminal 342 is selectively connected to the common terminal 340.

In the communication apparatus 300, when the power amplifier circuit 10 is caused to perform an ET (Envelope Tracking) operation, the ET modulator 321 causes a power supply voltage whose amplitude has been modulated in accordance with the amplitude level of a high frequency signal (transmission signal) input to the power amplifier circuit 10 from the signal processing circuit 301 to be supplied to the first power supply terminal 111 and the second power supply terminal 112. In the communication apparatus 300, when the power amplifier circuit 10 is not caused to perform an ET operation, a constant power supply voltage output from the constant voltage source 322 is supplied to the first power supply terminal 111 and the second power supply terminal 112. The power amplifier circuit 10 is capable of operating in a high output power mode (first power mode), a medium output power mode (second power mode), and a low output power mode (third power mode). In the case where the power amplifier circuit 10 operates in the high output power mode, the power amplifier circuit 10 outputs first predetermined power (for example, 22 dBm). In the case where the power amplifier circuit 10 operates in the medium output power mode, the power amplifier circuit 10 outputs second predetermined power (for example, 16 dBm), which is lower than the first predetermined power. In the case where the power amplifier circuit 10 operates in the low output power mode, the power amplifier circuit 10 outputs third predetermined power (for example, 10 dBm), which is lower than the second predetermined power.

In the case where the power amplifier circuit 10 operates in the high output power mode, a power supply voltage whose amplitude has been modulated is supplied from the ET modulator 321 to the first amplifier 1, the second amplifier 2, and the third amplifier 3. Furthermore, in the case where the power amplifier circuit 10 operates in the medium output power mode, a power supply voltage whose amplitude has been modulated is supplied from the ET modulator 321 to the first amplifier 1, the second amplifier 2, and the third amplifier 3. Furthermore, in the case where the power amplifier circuit 10 operates in the low output power mode, a constant power supply voltage is supplied from the constant voltage source 322 to the first amplifier 1, the second amplifier 2, and the third amplifier 3.

(1.3) Circuit Configuration of Power Amplifier Circuit

Figure 1:
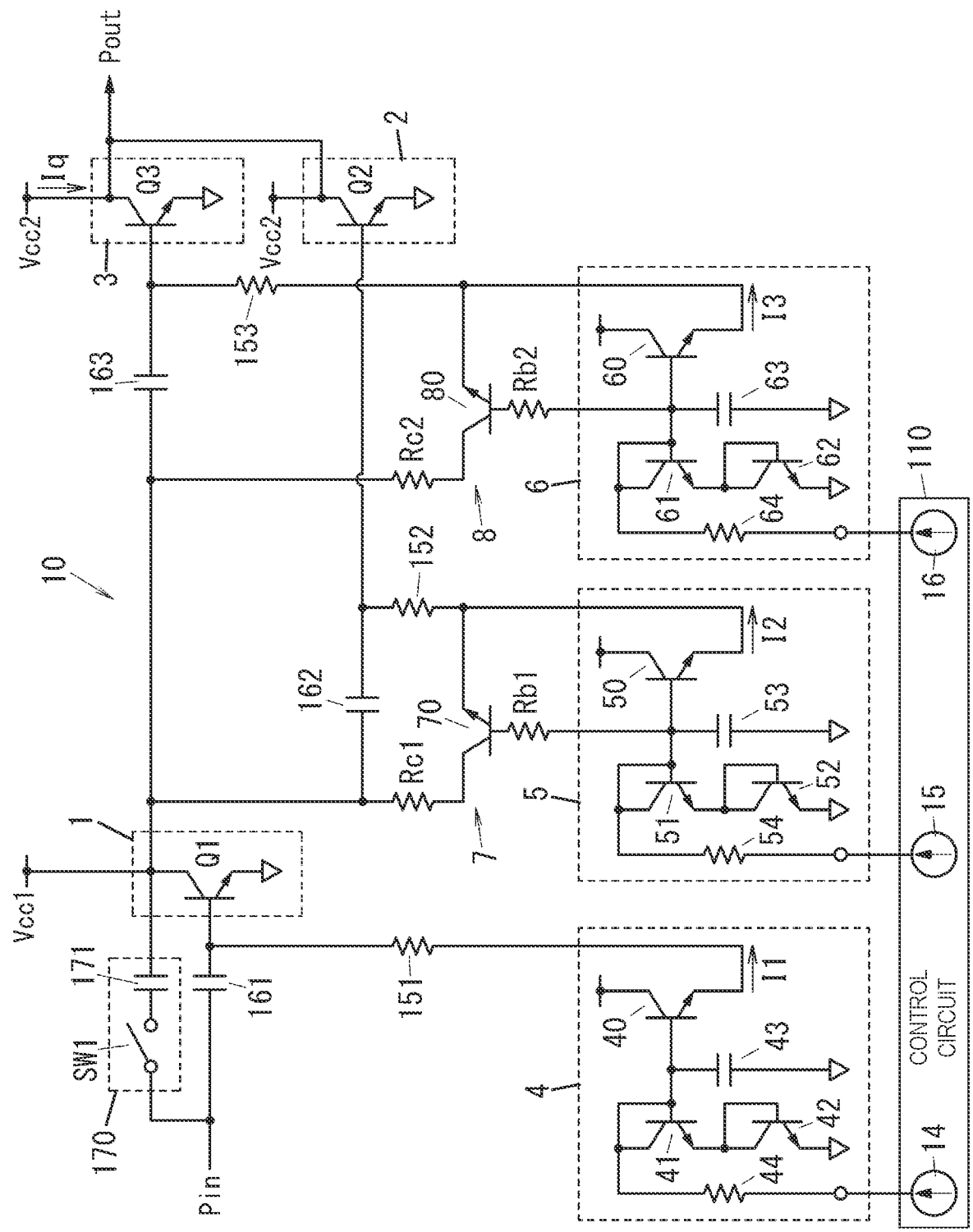
FIG. 1 is a circuit diagram of a power amplifier circuit according to an embodiment.

In the power amplifier circuit 10, as illustrated in FIGS. 1 and 2, the first amplifier 1, the second amplifier 2, and the third amplifier 3 include a first transistor Q1, a second transistor Q2, and a third transistor Q3, respectively. Each of the first transistor Q1, the second transistor Q2, and the third transistor Q3 is an amplifying transistor that amplifies power of a high frequency signal.

The power amplifier circuit 10 includes the first transistor Q1, the second transistor Q2, the third transistor Q3, a first bias circuit 4, a second bias circuit 5, a third bias circuit 6, a first current limiting circuit 7, and a second current limiting circuit 8. The first transistor Q1 includes a first base (base terminal), a first collector (collector terminal), and a first emitter (emitter terminal). The first transistor Q1 amplifies a high frequency signal input through the first base and outputs the amplified high frequency signal through the first collector. The second transistor Q2 includes a second base, a second collector, and a second emitter. The second base of the second transistor Q2 is connected to the first collector of the first transistor Q1. The third transistor Q3 includes a third base, a third collector, and a third emitter. The third base of the third transistor Q3 is connected to the first collector of the first transistor Q1, and the third collector of the third transistor Q3 is connected to the second collector of the second transistor Q2. The first bias circuit 4 supplies a first bias current I1 to the first base of the first transistor Q1. The second bias circuit 5 supplies a second bias current I2 to the second base of the second transistor Q2. The third bias circuit 6 supplies a third bias current I3 to the third base of the third transistor Q3. The first current limiting circuit 7 limits the second bias current I2 in accordance with a power supply voltage Vcc2 supplied to the second collector of the second transistor Q2. The second current limiting circuit 8 limits the third bias current I3 in accordance with the power supply voltage Vcc2. The power amplifier circuit 10 further includes a bypass circuit 170. The bypass circuit 170 includes a series circuit including a bypass switch SW1 and a capacitor 171. The bypass circuit 170 is connected between the first base and the first collector of the first transistor Q1. The base, emitter, and collector of a transistor will herein be referred to as a base terminal, an emitter terminal, and a collector terminal, respectively.

Each of the first transistor Q1, the second transistor Q2, and the third transistor Q3 is a bipolar transistor for amplification. In this example, each of the first transistor Q1, the second transistor Q2, and the third transistor Q3 is an npn-type bipolar transistor.

The first emitter of the first transistor Q1, the second emitter of the second transistor Q2, and the third emitter of the third transistor Q3 are connected to the ground. That is, the first emitter of the first transistor Q1, the second emitter of the second transistor Q2, and the third emitter of the third transistor Q3 are connected to the earth. The first collector of the first transistor Q1 is connected to the first power supply terminal 111 of the high frequency circuit 100, and a power supply voltage Vcc1 is supplied to the first collector of the first transistor Q1. The second collector of the second transistor Q2 and the third collector of the third transistor Q3 are connected to the second power supply terminal 112 of the high frequency circuit 100, and the power supply voltage Vcc2 is supplied to the second collector of the second transistor Q2 and the third collector of the third transistor Q3. The power supply voltage Vcc1 and the power supply voltage Vcc2 vary in a synchronous manner. That is, the power supply voltage Vcc2 increases when the power supply voltage Vcc1 increases, and the power supply voltage Vcc2 decreases when the power supply voltage Vcc1 decreases. The power amplifier circuit 10 further includes an input terminal 11 and an output terminal 12 (see FIG. 2). In the power amplifier circuit 10, the first base of the first transistor Q1 is connected to the input terminal 11. Furthermore, in the power amplifier circuit 10, the second collector of the second transistor Q2 and the third collector of the third transistor Q3 are connected to the output terminal 12. The third transistor Q3 is connected in parallel with the second transistor Q2. The first transistor Q1 is a drive-stage transistor that amplifies the power of a high frequency signal input through the first base and outputs the power-amplified high frequency signal through the first collector. The second transistor Q2 is an output-stage transistor that amplifies the power of a high frequency signal input through the second base and outputs the power-amplified high frequency signal through the second collector. The third transistor Q3 is an output-stage transistor that amplifies the power of a high frequency signal input through the third base and outputs the power-amplified high frequency signal through the third collector.

The power amplifier circuit 10 further includes a first capacitor 161, a second capacitor 162, and a third capacitor 163. The first capacitor 161, the second capacitor 162, and the third capacitor 163 are DC-cutting capacitive elements for removing a DC component from a high frequency signal. The first capacitor 161 is provided between the input terminal 11 (see FIG. 2) and the first base of the first transistor Q1. The second capacitor 162 is provided between the first collector of the first transistor Q1 and the second base of the second transistor Q2. The third capacitor 163 is provided between the first collector of the first transistor Q1 and the third base of the third transistor Q3. As illustrated in FIG. 2, the power amplifier circuit 10 further includes a first matching circuit 130, a second matching circuit 140, and a third matching circuit 150. The first matching circuit 130 is provided between the input terminal 11 and the first amplifier 1. The second matching circuit 140 is provided between the first amplifier 1 and the second amplifier 2. The third matching circuit 150 is provided between the first amplifier 1 and the third amplifier 3. The first matching circuit 130 is a circuit for achieving impedance matching between the first amplifier 1 and the signal processing circuit 301. The second matching circuit 140 is a circuit (inter-stage matching circuit) for achieving impedance matching between the first amplifier 1 and the second amplifier 2. The third matching circuit 150 is a circuit (inter-stage matching circuit) for achieving impedance matching between the first amplifier 1 and the third amplifier 3.

The first bias circuit 4 includes a fourth transistor 40. The fourth transistor 40 includes a fourth base, a fourth collector, and a fourth emitter. The fourth emitter of the fourth transistor 40 is connected to the first base of the first transistor Q1. More particularly, the fourth emitter of the fourth transistor 40 is connected to the first base of the first transistor Q1 with a first resistor 151 interposed therebetween. The fourth transistor 40 is an npn-type bipolar transistor. The first bias current I1 output from the first bias circuit 4 is supplied through the first resistor 151 to the first base of the first transistor Q1. The first bias current I1 is a DC current for determining an operation point of the first transistor Q1. In the first bias circuit 4, the fourth transistor 40 is used as an emitter-follower transistor. The fourth transistor 40 is a current-amplifying transistor.

The first bias circuit 4 includes two diodes 41 and 42, a capacitor 43, and a resistor 44 as well as the fourth transistor 40 described above. Each of the two diodes 41 and 42 is configured by connecting the base and the collector of an npn-type transistor.

In the first bias circuit 4, the two diodes 41 and 42 are connected in series between the fourth base of the fourth transistor 40 and the ground. Furthermore, in the first bias circuit 4, a first constant current source 14 included in a control circuit 110 included in the high frequency circuit 100 is connected to the fourth base of the fourth transistor 40 with the resistor 44 interposed therebetween. Furthermore, in the first bias circuit 4, the capacitor 43 is connected between the fourth base of the fourth transistor 40 and the ground.

In the first bias circuit 4, a constant current output from the first constant current source 14 is input to the fourth base of the fourth transistor 40, and the constant current is amplified and turned into the first bias current I1 and is output through the fourth emitter of the fourth transistor 40. The first bias current I1 output through the fourth emitter of the fourth transistor 40 passes through the first resistor 151 and is supplied to the first base of the first transistor Q1.

The second bias circuit 5 includes a fifth transistor 50. The fifth transistor 50 includes a fifth base, a fifth collector, and a fifth emitter. The fifth emitter of the fifth transistor 50 is connected to the second base of the second transistor Q2. More particularly, the fifth emitter of the fifth transistor 50 is connected to the second base of the second transistor Q2 with a second resistor 152 interposed therebetween. The fifth transistor 50 is an npn-type bipolar transistor. The second bias current I2 output from the second bias circuit 5 is supplied through the second resistor 152 to the second base of the second transistor Q2. The second bias current I2 is a DC current for determining an operation point of the second transistor Q2. In the second bias circuit 5, the fifth transistor 50 is used as an emitter-follower transistor. The fifth transistor 50 is a current-amplifying transistor.

The second bias circuit 5 includes two diodes 51 and 52, a capacitor 53, and a resistor 54 as well as the fifth transistor 50 described above. Each of the two diodes 51 and 52 is configured by connecting the base and the collector of an npn-type transistor.

In the second bias circuit 5, the two diodes 51 and 52 are connected in series between the fifth base of the fifth transistor 50 and the ground. Furthermore, in the second bias circuit 5, a second constant current source 15 included in the control circuit 110 is connected to the fifth base of the fifth transistor 50 with the resistor 54 interposed therebetween. Furthermore, in the second bias circuit 5, the capacitor 53 is connected between the fifth base of the fifth transistor 50 and the ground.

In the second bias circuit 5, a constant current output from the second constant current source 15 is input to the fifth base of the fifth transistor 50, and the constant current is amplified and turned into the second bias current I2 and is output through the fifth emitter of the fifth transistor 50. The second bias current I2 output through the fifth emitter of the fifth transistor 50 passes through the second resistor 152 and is supplied to the second base of the second transistor Q2.

The third bias circuit 6 includes a sixth transistor 60. The sixth transistor 60 includes a sixth base, a sixth collector, and a sixth emitter. The sixth emitter of the sixth transistor 60 is connected to the third base of the third transistor Q3. More particularly, the sixth emitter of the sixth transistor 60 is connected to the third base of the third transistor Q3 with a third resistor 153 interposed therebetween. The sixth transistor 60 is an npn-type bipolar transistor. The third bias current I3 output from the third bias circuit 6 is supplied through the third resistor 153 to the third base of the third transistor Q3. The third bias current I3 is a DC current for determining an operation point of the third transistor Q3. In the third bias circuit 6, the sixth transistor 60 is used as an emitter-follower transistor. The sixth transistor 60 is a current-amplifying transistor.

The third bias circuit 6 includes two diodes 61 and 62, a capacitor 63, and a resistor 64 as well as the sixth transistor 60 described above. Each of the two diodes 61 and 62 is configured by connecting the base and the collector of an npn-type transistor.

In the third bias circuit 6, the two diodes 61 and 62 are connected in series between the sixth base of the sixth transistor 60 and the ground. Furthermore, in the third bias circuit 6, a third constant current source 16 included in the control circuit 110 is connected to the sixth base of the sixth transistor 60 with the resistor 64 interposed therebetween.

Furthermore, in the third bias circuit 6, the capacitor 63 is connected between the sixth base of the sixth transistor 60 and the ground.

In the third bias circuit 6, a constant current output from the third constant current source 16 is input to the sixth base of the sixth transistor 60, and the constant current is amplified and turned into the third bias current I3 and is output through the sixth emitter of the sixth transistor 60. The third bias current I3 output through the sixth emitter of the sixth transistor 60 passes through the third resistor 153 and is supplied to the third base of the third transistor Q3.

The first current limiting circuit 7 is a circuit that limits the second bias current I2 output from the second bias circuit 5. More specifically, the first current limiting circuit 7 includes a seventh transistor 70, a first collector resistor Rc1, and a first base resistor Rb1. The seventh transistor 70 includes a seventh base, a seventh collector, and a seventh emitter. The seventh emitter of the seventh transistor 70 is connected to the fifth emitter of the fifth transistor 50. A first end of the first collector resistor Rc1 is connected to the seventh collector of the seventh transistor 70, and a second end of the first collector resistor Rc1 is connected to the first collector of the first transistor Q1. Thus, the second end of the first collector resistor Rc1 is connected to the first power supply terminal 111 (see FIG. 2) to which the power supply voltage Vcc1 is supplied. The first base resistor Rb1 includes a first end and a second end. The first end of the first base resistor Rb1 is connected to the seventh base of the seventh transistor 70, and the second end of the first base resistor Rb1 is connected to the fifth base of the fifth transistor 50. The seventh transistor 70 is a current-limiting transistor.

In the case where the power supply voltage Vcc1 (equal to the power supply voltage Vcc2) is lower than a reference voltage (VBE: voltage between base and emitter), the first current limiting circuit 7 increases a DC limit current, which is a DC current flowing from the fifth base of the fifth transistor 50 of the second bias circuit 5 through the seventh base of the seventh transistor 70 to the seventh collector of the seventh transistor 70 as the potential difference between the power supply voltage Vcc1 (equal to the power supply voltage Vcc2) and the reference voltage increases.

The second current limiting circuit 8 is a circuit that limits the third bias current I3 output from the third bias circuit 6. More specifically, the second current limiting circuit 8 includes an eighth transistor 80, a second collector resistor Rc2, and a second base resistor Rb2. The eighth transistor 80 includes an eighth base, an eighth collector, and an eighth emitter. The eighth emitter of the eighth transistor 80 is connected to the sixth emitter of the sixth transistor 60. The second collector resistor Rc2 includes a first end and a second end. The first end of the second collector resistor Rc2 is connected to the eighth collector of the eighth transistor 80, and the second end of the second collector resistor Rc2 is connected to the first collector of the first transistor Q1. Thus, the second end of the second collector resistor Rc2 is connected to the first power supply terminal 111 (see FIG. 2) to which the power supply voltage Vcc1 is supplied. The second base resistor Rb2 includes a first end and a second end. The first end of the second base resistor Rb2 is connected to the eighth base of the eighth transistor 80, and the second end of the second base resistor Rb2 is connected to the sixth base of the sixth transistor 60. The eighth transistor 80 is a current-limiting transistor.

The bypass circuit 170 includes a series circuit including the bypass switch SW1 and the capacitor 171. The bypass circuit 170 is connected between the first base and first collector of the first transistor Q1.

For example, the power amplifier circuit 10 is included in a one-chip IC chip. The IC chip including the power amplifier circuit 10 is, for example, a GaAs IC chip. In this case, each of the first transistor Q1, the second transistor Q2, and the third transistor Q3 is, for example, an HBT (Heterojunction Bipolar Transistor).

The IC chip including the power amplifier circuit 10 is not necessarily a GaAs IC chip but may be, for example, an Si IC chip including the power amplifier circuit 10 or an SiGe IC chip including the power amplifier circuit 10.

For example, the power amplifier circuit 10 is controlled by the control circuit 110 included in the high frequency circuit 100. The control circuit 110 is, for example, a control IC (Integrated Circuit) that controls the power amplifier circuit 10. The control circuit 110 controls the first bias circuit 4, the second bias circuit 5, and the third bias circuit 6. As described above, the control circuit 110 is not a component of the power amplifier circuit 10 but is a component of the high frequency circuit 100. The control circuit 110 includes the first constant current source 14, the second constant current source 15, and the third constant current source 16 as described above.

For example, the control circuit 110 is included in a one-chip IC chip different from that including the power amplifier circuit 10. The IC chip including the control circuit 110 is, for example, an Si IC chip.

For example, the control circuit 110 is connected to the signal processing circuit 301. The control circuit 110 controls the power amplifier circuit 10 in accordance with a control signal acquired from the signal processing circuit 301. The control circuit 110 conforms to, for example, MIPI standards. The control circuit 110 controls the power amplifier circuit 10 in accordance with a control signal from the RF signal processing circuit 302 of the signal processing circuit 301.

(2) Operation of Power Amplifier Circuit

For example, the power amplifier circuit 10 amplifies a high frequency signal (transmission signal) from the signal processing circuit 301 and outputs the amplified high frequency signal. The power amplifier circuit 10 amplifies a high frequency signal input through the input terminal 11 and outputs the amplified high frequency signal through the output terminal 12.

The power amplifier circuit 10 is capable of operating in the high output power mode, the medium output power mode, and the low output power mode. The power amplifier circuit 10 is controlled by the control circuit 110.

In the case where the control circuit 110 causes the power amplifier circuit 10 to operate in the high output power mode, the control circuit 110 controls the first bias circuit 4 and controls both the second bias circuit 5 and the third bias circuit 6. That is, in the case where the control circuit 110 causes the power amplifier circuit 10 to operate in the high output power mode, the control circuit 110 controls the first bias circuit 4, the second bias circuit 5, and the third bias circuit 6 to amplify and output high frequency signals input to the first transistor Q1, the second transistor Q2, and the third transistor Q3.

In the case where the control circuit 110 causes the power amplifier circuit 10 to operate in the medium output power mode, the control circuit 110 controls the first bias circuit 4 and controls only the third bias circuit 6 among the second bias circuit 5 and the third bias circuit 6. That is, in the case where the control circuit 110 causes the power amplifier circuit 10 to operate in the medium output power mode, the control circuit 110 controls the first bias circuit 4 and the third bias circuit 6 to amplify and output high frequency signals input to the first transistor Q1 and the third transistor Q3.

In the case where the control circuit 110 causes the power amplifier circuit 10 to operate in the low output power mode, the control circuit 110 controls only the third bias circuit 6 among the first bias circuit 4, the second bias circuit 5, and the third bias circuit 6. That is, in the case where the control circuit 110 causes the power amplifier circuit 10 to operate in the low output power mode, the control circuit 110 controls the third bias circuit 6 to amplify and output a high frequency signal input to the third transistor Q3. In the case where the control circuit 110 causes the power amplifier circuit 10 to operate in the low output power mode, the control circuit 110 controls the bypass switch SW1 of the bypass circuit 170 to be turned on.

The power amplifier circuit 10 includes the first current limiting circuit 7. Thus, in the power amplifier circuit 10, the static characteristics of the second transistor Q2 have a slope. In this example, regarding the static characteristics of the second transistor Q2, the collector current flowing in the second transistor Q2 decreases as the power supply voltage Vcc2 decreases. This is because in the power amplifier circuit 10 the first current limiting circuit 7 limits (reduces), in accordance with the decrease in the power supply voltage Vcc2, the second bias current I2 output from the second bias circuit 5. That is, in the communication apparatus 300 including the power amplifier circuit 10, for example, when the ET modulator 321 reduces the power supply voltage Vcc2 in accordance with the amplitude of the power of a high frequency signal, the second bias current I2 supplied to the second base of the second transistor Q2 from the second bias circuit 5 is limited and reduced by the first current limiting circuit 7. Thus, in the second transistor Q2, the collector current flowing depending on the second bias current I2 decreases in accordance with the decrease in the power supply voltage Vcc2. The slope of the static characteristics of the second transistor Q2 can be varied by changing at least one of the resistance of the first collector resistor Rc1 and the resistance of the first base resistor Rb1.

In the power amplifier circuit 10, with the provision of the second current limiting circuit 8, the static characteristics of the third transistor Q3 have a slope. In this example, regarding the static characteristics of the third transistor Q3, the collector current flowing in the third transistor Q3 decreases as the power supply voltage Vcc2 decreases. This is because in the power amplifier circuit 10 the second current limiting circuit 8 limits (reduces), in accordance with the decrease in the power supply voltage Vcc2, the third bias current I3 output from the third bias circuit 6. That is, in the communication apparatus 300 including the power amplifier circuit 10, for example, when the ET modulator 321 reduces the power supply voltage Vcc2 in accordance with the amplitude of the power of a high frequency signal, the third bias current I3 supplied to the third base of the third transistor Q3 from the third bias circuit 6 is limited and reduced by the second current limiting circuit 8. Thus, in the third transistor Q3, the collector current flowing depending on the third bias current I3 decreases in accordance with the decrease in the power supply voltage Vcc2. The slope of the static characteristics of the third transistor Q3 can be varied by changing at least one of the resistance of the second collector resistor Rc2 and the resistance of the second base resistor Rb2.

For example, by satisfying a first condition and a second condition, the power amplifier circuit 10 makes the slope of the static characteristics of the second transistor Q2 different from the slope of the static characteristics of the third transistor Q3. The first condition is that the resistance of the first base resistor Rb1 is different from the resistance of the second base resistor Rb2. The second condition is that the resistance of the first collector resistor Rc1 is different from the resistance of the second collector resistor Rc2. When at least one of the first condition and the second condition is changed, the power amplifier circuit 10 is able to make the slope of the static characteristics of the second transistor Q2 different from the slope of the static characteristics of the third transistor Q3. The power amplifier circuit 10 is configured such that when at least one of the first condition and the second condition is satisfied, the slope of the static characteristics of the third transistor Q3 is greater than the slope of the static characteristics of the second transistor Q2.

Figure 3:
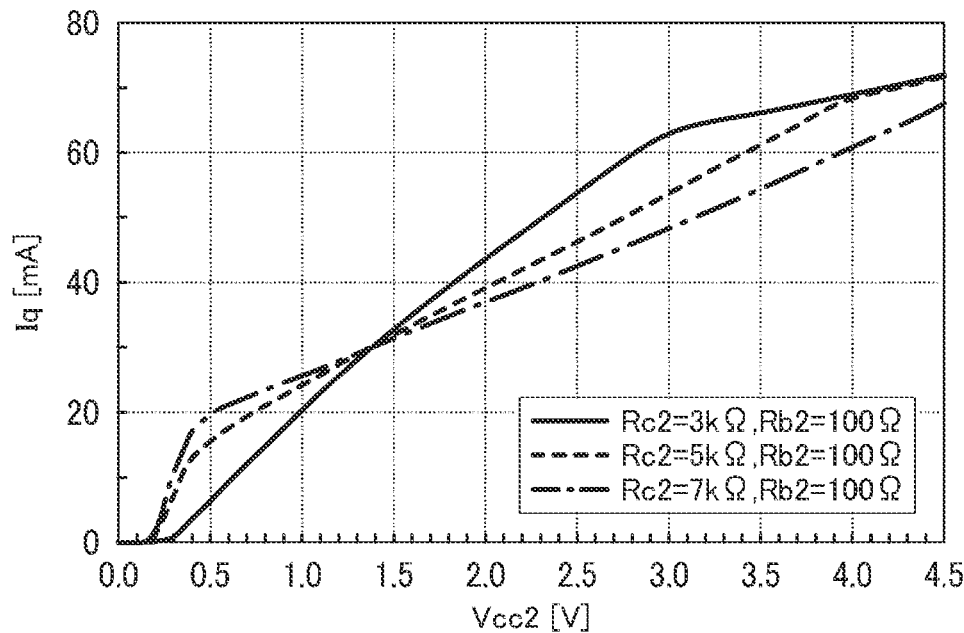
FIG. 3 illustrates characteristics between a second power supply voltage and a collector current of a third transistor in the case where the resistance of a second collector resistor is varied while the resistance of a second base resistor is kept constant in the power amplifier circuit.

FIG. 3 illustrates static characteristics of the third transistor Q3 in the case where the resistance of the second base resistor Rb2 is set to 100Ω and the resistance of the second collector resistor Rc2 is set to 3 kΩ, 5 kΩ, and 7 kΩ. The horizontal axis in FIG. 3 represents the power supply voltage Vcc2 supplied to the third collector of the third transistor Q3, and the vertical axis in FIG. 3 represents a collector current Iq flowing in the third collector of the third transistor Q3. In FIG. 3, static characteristics in the case where the resistance of the second collector resistor Rc2 is set to 3 kΩ and the resistance of the second base resistor Rb2 is set to 100 kΩ are indicated by a solid line. Furthermore, in FIG. 3, static characteristics in the case where the resistance of the second collector resistor Rc2 is set to 5 kΩ and the resistance of the second base resistor Rb2 is set to 100 kΩ are indicated by a broken line. Furthermore, in FIG. 3, static characteristics in the case where the resistance of the second collector resistor Rc2 is set to 7 kΩ and the resistance of the second base resistor Rb2 is set to 100Ω are indicated by a one-dot chain line. As is clear from FIG. 3, with the same resistance of the second base resistor Rb2, the slope of the static characteristics of the third transistor Q3 tends to increase as the resistance of the second collector resistor Rc2 decreases. This tendency is also seen in the static characteristics of the second transistor Q2.

Figure 4:
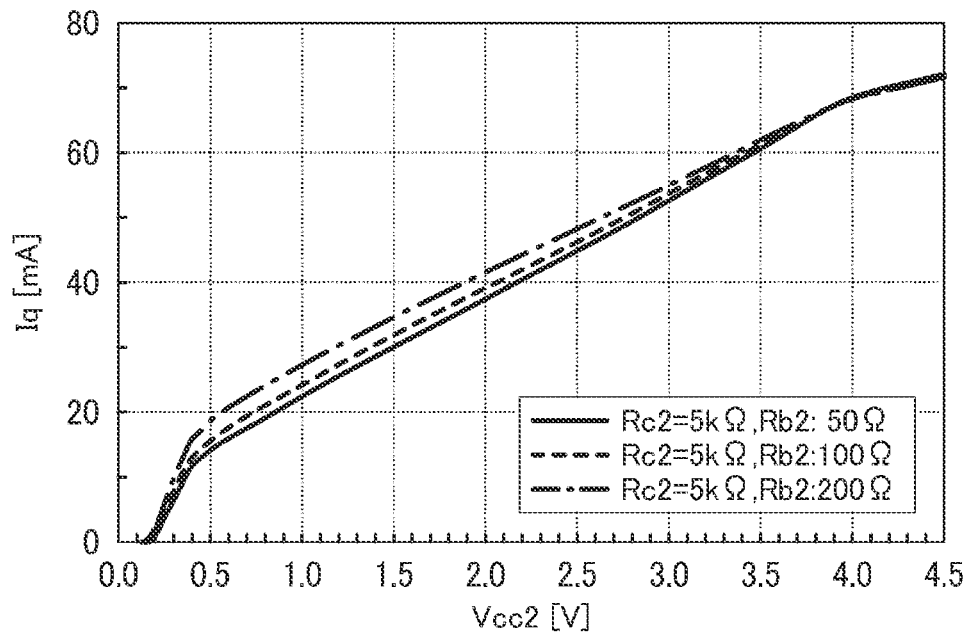
FIG. 4 illustrates characteristics between the second power supply voltage and the collector current of the third transistor in the case where the resistance of the second base resistor is varied while the resistance of the second collector resistor is kept constant in the power amplifier circuit.

FIG. 4 illustrates static characteristics of the third transistor Q3 in the case where the resistance of the second collector resistor Rc2 is set to 5 kΩ and the resistance of the second base resistor Rb2 is set to 50 Ω, 100Ω, and 200Ω. The horizontal axis in FIG. 4 represents the power supply voltage Vcc2 supplied to the third collector of the third transistor Q3, and the vertical axis of FIG. 4 represents the collector current Iq flowing in the third collector of the third transistor Q3. In FIG. 4, static characteristics in the case where the resistance of the second collector resistor Rc2 is set to 5 kΩ and the resistance of the second base resistor Rb2 is set to 50Ω are indicated by a solid line. Furthermore, in FIG. 4, static characteristics in the case where the resistance of the second collector resistor Rc2 is set to 5 kΩ and the resistance of the second base resistor Rb2 is set to 100Ω are indicated by a broken line. Furthermore, in FIG. 4, static characteristics in the case where the resistance of the second collector resistor Rc2 is set to 5 kΩ and the resistance of the second base resistor Rb2 is set to 200 kΩ are indicated by a one-dot chain line. As is clear from FIG. 4, with the same resistance of the second collector resistor Rc2, the slope of the static characteristics of the third transistor Q3 tends to increase as the resistance of the second base resistor Rb2 decreases. This tendency is also seen in the static characteristics of the second transistor Q2.

Figure 5:
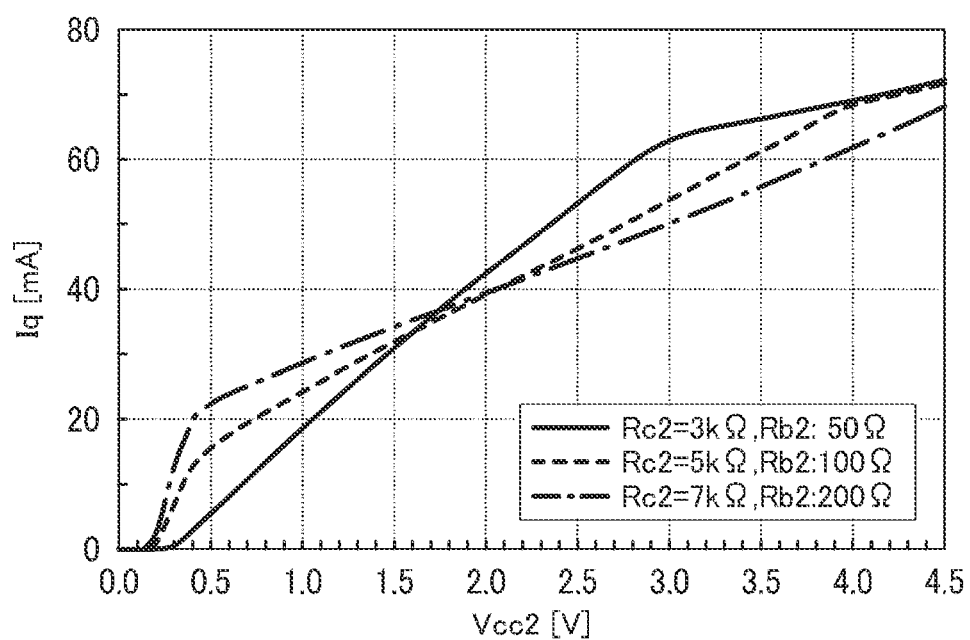
FIG. 5 illustrates characteristics between the second power supply voltage and the collector current of the third transistor in the case where the resistance of the second base resistor and the resistance of the second collector resistor are varied in the power amplifier circuit.
Figure 6A:
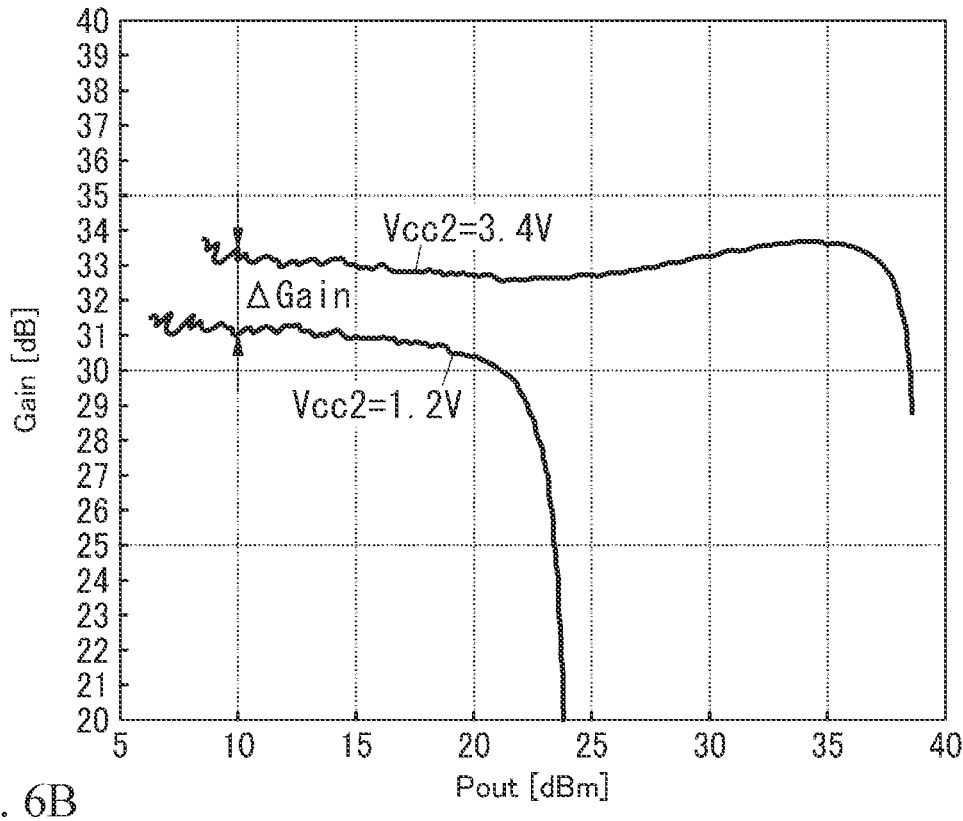
FIG. 6A is an explanatory diagram of a gain dispersion obtained in the power amplifier circuit in a high output power mode.
Figure 6B:
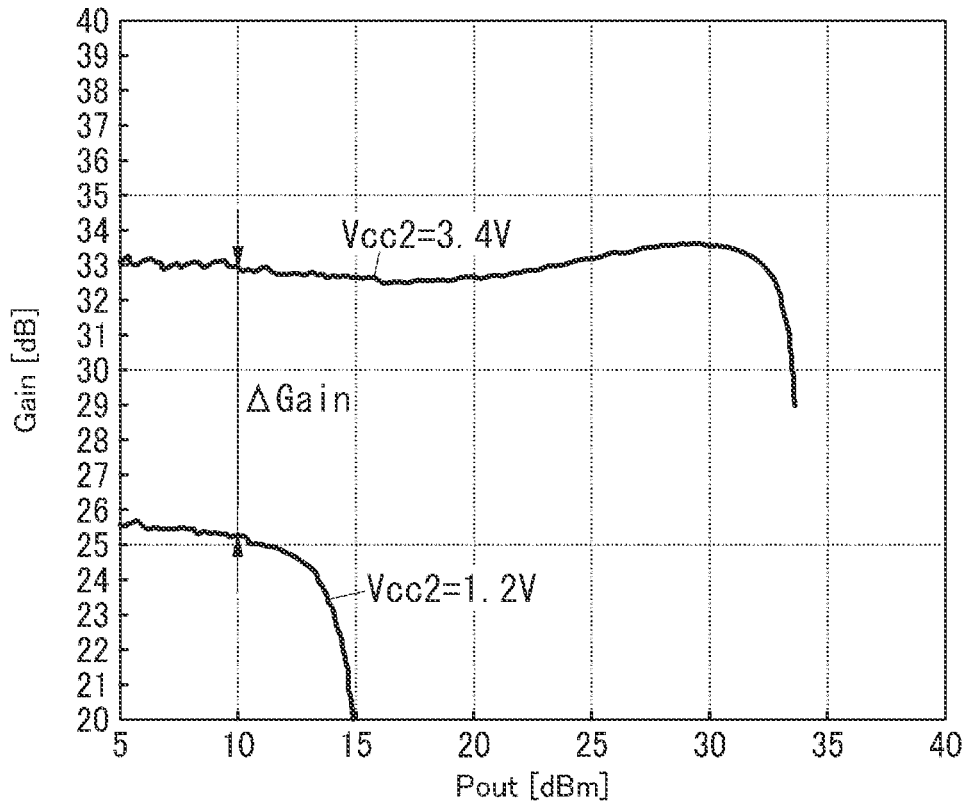
FIG. 6B is an explanatory diagram of gain dispersion obtained in the power amplifier circuit in a medium output power mode.

In FIG. 5, the static characteristics of the third transistor Q3 in the case where the resistance of the second collector resistor Rc2 is set to 3 kΩ and the resistance of the second base resistor Rb2 is set to 50Ω are indicated by a solid line. Furthermore, in FIG. 5, the static characteristics of the third transistor Q3 in the case where the resistance of the second collector resistor Rc2 is set to 5 kΩ and the resistance of the second base resistor Rb2 is set to 100Ω are indicated by a broken line. Furthermore, in FIG. 5, the static characteristics in the case where the resistance of the second collector resistor Rc2 is set to 7 kΩ and the resistance of the second base resistor Rb2 is set to 200Ω are indicated by a one-dot chain line. The horizontal axis in FIG. 5 represents the power supply voltage Vcc2 supplied to the third collector of the third transistor Q3, and the vertical axis in FIG. 5 represents the collector current Iq flowing in the third collector of the third transistor Q3. As is clear from FIGS. 3 to 5, the impact of the resistance of the second collector resistor Rc2 on the slope of the static characteristics of the third transistor Q3 tends to be larger than the impact of the resistance of the second base resistor Rb2. This tendency is also seen in the static characteristics of the second transistor Q2.

In the power amplifier circuit 10, as described above, the slope of the static characteristics of the third transistor Q3 is greater than the slope of the static characteristics of the second transistor Q2. Thus, in the power amplifier circuit 10, a gain dispersion ΔGain (see FIG. 6B) obtained in the case where the first bias current I1 is supplied to the first transistor Q1, the second bias current I2 is not supplied to the second transistor Q2, and the third bias current I3 is supplied to the third transistor Q3 is greater than a gain dispersion ΔGain (see FIG. 6A) obtained in the case where the first bias current I1, the second bias current I2, and the third bias current I3 are supplied to the first transistor Q1, the second transistor Q2, and the third transistor Q3, respectively. In each of FIGS. 6A and 6B, the horizontal axis represents an output power Pout of the power amplifier circuit 10, and the vertical axis represents a gain of the power amplifier circuit 10. In each of FIGS. 6A and 6B, characteristics between the gain and the output power for the case where Vcc is set to 1.2 V and characteristics between the gain and the output power for the case where Vcc is set to 3.4 V are illustrated. "Pin" in FIG. 1 represents the input power of a high frequency signal input to the power amplifier circuit 10.

In the power amplifier circuit 10, a high frequency signal that has been power-amplified by the first transistor Q1 is power-amplified by the second transistor Q2 and the third transistor Q3 in the high output power mode, and a high frequency signal that has been power-amplified by the first transistor Q1 is power-amplified by only the third transistor Q3 among the second transistor Q2 and the third transistor Q3 in the medium output power mode. Thus, the power amplifier circuit 10 is capable of making a gain dispersion ΔGain different between the high output power mode and the medium output power mode. That is, the power amplifier circuit 10 is capable of making the gain dispersion ΔGain obtained in the medium output power mode greater than the gain dispersion ΔGain obtained in the high output power mode.

Figure 7:
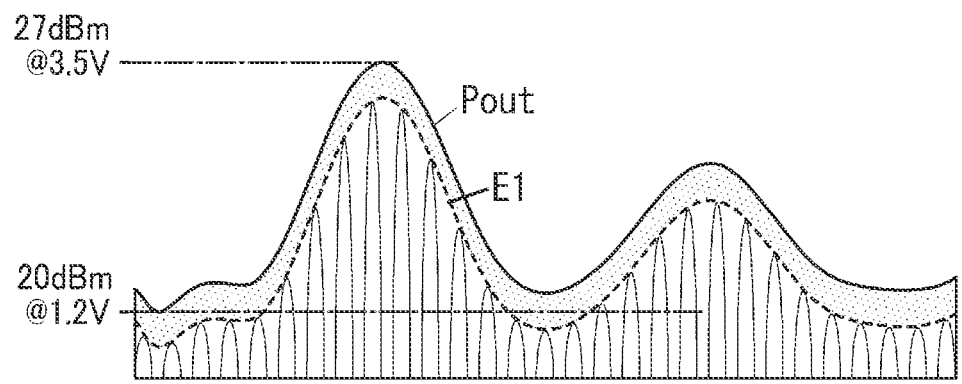
FIG. 7 is an operation explanatory diagram of the power amplifier circuit in the high output power mode.
Figure 8A:
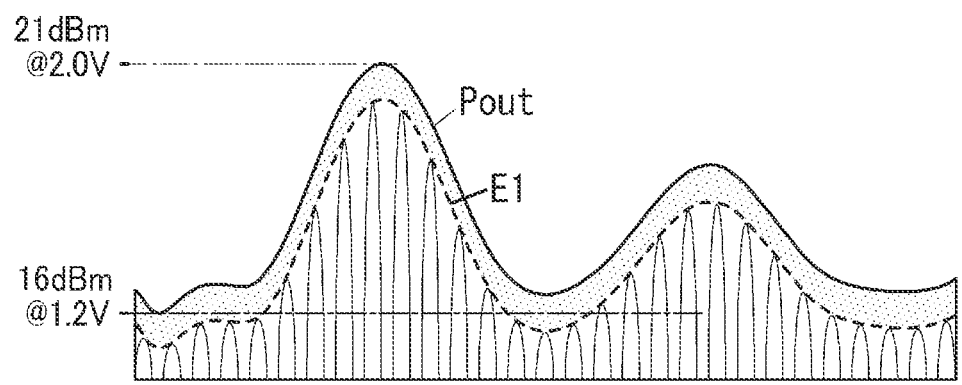
FIG. 8A is an operation explanatory diagram of the power amplifier circuit in the medium output power mode.
Figure 8B:
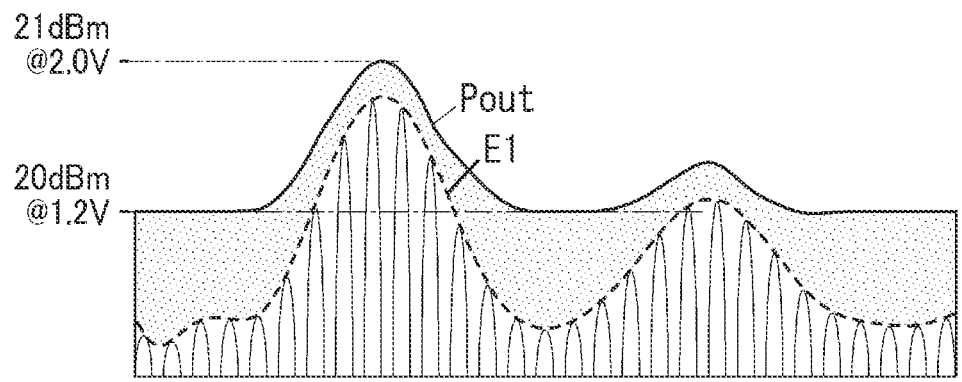
FIG. 8B is an operation explanatory diagram of a power amplifier circuit according to a comparative example in the medium output power mode.

FIG. 7 is an operation explanatory diagram of the power amplifier circuit 10 in the high output power mode. FIG. 8A is an operation explanatory diagram of the power amplifier circuit 10 in the medium output power mode. FIG. 8B is an operation explanatory diagram of a power amplifier circuit according to a comparative example in the medium output power mode. The power amplifier circuit according to the comparative example is a power amplifier circuit that uses only two amplifying transistor, which are a first amplifying transistor and a second amplifying transistor, as transistors for amplifying a high frequency signal, as in Patent Document 1. In each of FIGS. 7, 8A, and 8B, "Pout" represents a voltage component of an output power Pout, and "E1" represents an envelope signal detected by the ET modulator 321. Thus, in FIGS. 7, 8A, and 8B, a power-added efficiency increases as the difference between Pout and E1 (the area of a part with dot hatching) decreases, and the power-added efficiency decreases as the difference between Pout and E1 increases.

For example, the ET modulator 321 includes a DC-DC converter that generates the power supply voltage Vcc2 in accordance with an envelope signal. In the ET modulator 321 including the DC-DC converter, the minimum voltage of the power supply voltage Vcc2 is set to, for example, 1.2 V, taking into consideration the impact of noise or the like generated in the DC-DC converter, so that the power supply voltage Vcc2 in an ET operation does not become 0 V. The maximum voltage of the power supply voltage Vcc2 is set to, for example, 3.5 V.

In the power amplifier circuit 10, with a predetermined high-frequency output power, the power-added efficiency increases as the power supply voltage Vcc2 (and the power supply voltage Vcc1) decreases. In the communication apparatus 300 including the power amplifier circuit 10 and the ET modulator 321, a voltage component of the output power Pout of a high frequency signal output from the power amplifier circuit 10 is expressed as a linear function of the power supply voltage Vcc2. However, in the case where the power amplifier circuit according to the comparative example is designed such that a power supply voltage (corresponding to the power supply voltage Vcc2) supplied to the collector of the second amplifying transistor is set to 1.2 V and the same power-added efficiency as that obtained in the power amplifier circuit 10 according to the embodiment can be obtained in the high output power mode, conformability of Pout with respect to E1 decreases (the difference between Pout and E1 increases) and the power-added efficiency decreases when the power amplifier circuit operates in the medium output power mode, as illustrated in FIG. 8B. In contrast, the power amplifier circuit 10 according to the embodiment operating in the medium output power mode can achieve a large gain dispersion ΔGain compared to the high output power mode. Thus, as illustrated in FIG. 8A, the conformability of Pout with respect to E1 increases (the difference between Pout and E1 decreases), and the power-added efficiency increases.

For example, in the communication apparatus 300, in the case where the power amplifier circuit 10 operates in the low output power mode, the power supply voltage Vcc1 and the power supply voltage Vcc2 are supplied to the first power supply terminal 111 and the second power supply terminal 112, respectively, not from the ET modulator 321 but from the constant voltage source 322 through the switch 304. Furthermore, in the case where the power amplifier circuit 10 operates in the low output power mode, the control circuit 110 turns on the bypass switch SW1. In the case where the power amplifier circuit 10 operates in the low output power mode, a high frequency signal is amplified by only the third transistor Q3 among the first transistor Q1, the second transistor Q2, and the third transistor Q3.

(3) Conclusion

(3.1) Power Amplifier Circuit

The power amplifier circuit 10 according to an embodiment includes the first transistor Q1, the second transistor Q2, the third transistor Q3, the first bias circuit 4, the second bias circuit 5, the third bias circuit 6, the first current limiting circuit 7, and the second current limiting circuit 8. The first transistor Q1 includes the first base, the first collector, and the first emitter. The second transistor Q2 includes the second base, the second collector, and the second emitter. The second base of the second transistor Q2 is connected to the first collector of the first transistor Q1. The third transistor Q3 includes the third base, the third collector, and the third emitter. The third base of the third transistor Q3 is connected to the first collector of the first transistor Q1, and the third collector of the third transistor Q3 is connected to the second collector of the second transistor Q2. The first bias circuit 4 includes the fourth transistor 40 connected to the first base. The second bias circuit 5 includes the fifth transistor 50 connected to the second base. The third bias circuit 6 includes the sixth transistor 60 connected to the third base. The fourth transistor 40 includes the fourth base, the fourth collector, and the fourth emitter. The fifth transistor 50 includes the fifth base, the fifth collector, and the fifth emitter. The sixth transistor 60 includes the sixth base, the sixth collector, and the sixth emitter. The first current limiting circuit 7 includes the seventh transistor 70, the first collector resistor Rc1, and the first base resistor Rb1. The seventh transistor 70 includes the seventh base, the seventh collector, and the seventh emitter. The seventh emitter of the seventh transistor 70 is connected to the fifth emitter of the fifth transistor 50. The first collector resistor Rc1 includes the first end and the second end. The first end of the first collector resistor Rc1 is connected to the seventh collector of the seventh transistor 70, and the second end of the first collector resistor Rc1 is connected to the first collector of the first transistor Q1. The first base resistor Rb1 includes the first end and the second end. The first end of the first base resistor Rb1 is connected to the seventh base of the seventh transistor 70, and the second end of the first base resistor Rb1 is connected to the fifth base of the fifth transistor 50. The second current limiting circuit 8 includes the eighth transistor 80, the second collector resistor Rc2, and the second base resistor Rb2. The eighth transistor 80 includes the eighth base, the eighth collector, and the eighth emitter. The eighth emitter of the eighth transistor 80 is connected to the sixth emitter of the sixth transistor 60. The second collector resistor Rc2 includes the first end and the second end. The first end of the second collector resistor Rc2 is connected to the eighth collector of the eighth transistor 80, and the second end of the second collector resistor Rc2 is connected to the first collector of the first transistor Q1. The second base resistor Rb2 includes the first end and the second end. The first end of the second base resistor Rb2 is connected to the eighth base of the eighth transistor 80, and the second end of the second base resistor Rb2 is connected to the sixth base of the sixth transistor 60. The power amplifier circuit 10 satisfies at least one of the first condition and the second condition. The first condition is that the resistance of the first base resistor Rb1 is different from the resistance of the second base resistor Rb2. The second condition is that the resistance of the first collector resistor Rc1 is different from the resistance of the second collector resistor Rc2.

In the power amplifier circuit 10 according to the embodiment, increase in power-added efficiency can be achieved. Furthermore, in the power amplifier circuit 10 according to the embodiment, improvement in linearity can be achieved. Thus, the power amplifier circuit 10 according to the embodiment can achieve increase in the power-added efficiency and improvement in the linearity during an operation in the medium power output mode.

(3.2) High Frequency Circuit

The high frequency circuit 100 according to an embodiment includes the power amplifier circuit 10 and the control circuit 110. The control circuit 110 controls the power amplifier circuit 10. Thus, in the high frequency circuit 100 according to the embodiment, increase in the power-added efficiency of the power amplifier circuit 10 can be achieved. In the high frequency circuit 100 according to the embodiment, improvement in the linearity of the power amplifier circuit 10 can be achieved.

(3.3) Communication Apparatus

The communication apparatus 300 according to an embodiment includes the high frequency circuit 100 and the signal processing circuit 301. The power amplifier circuit 10 of the high frequency circuit 100 amplifies a high frequency signal input from the signal processing circuit 301. Thus, in the communication apparatus 300 according to the embodiment, increase in the power-added efficiency of the power amplifier circuit 10 can be achieved. Furthermore, in the communication apparatus 300 according to the embodiment, improvement in the linearity of the power amplifier circuit 10 can be achieved.

Modification

The embodiments described above are merely some of the various embodiments of the present disclosure. Various changes may be made to the embodiments described above in accordance with design and the like.

For example, when a condition (third condition) that the gain dispersion ΔGain obtained in the case where the first bias current I1 is supplied to the first transistor Q1, the second bias current I2 is not supplied to the second transistor Q2, and the third bias current I3 is supplied to the third transistor Q3 is greater than the gain dispersion ΔGain obtained in the case where the first bias current I1 is supplied to the first transistor Q1, the second bias current I2 is supplied to the second transistor Q2, and the third bias current I3 is supplied to the third transistor Q3 is satisfied, the first current limiting circuit 7 and the second current limiting circuit 8 are not necessarily provided in the power amplifier circuit 10. For example, the third condition may be satisfied by making the parasitic capacitance between the third base and the third collector of the third transistor Q3 different from the parasitic capacitance between the second base and the second collector of the second transistor Q2. A slope of static characteristics of a transistor tends to increase as the parasitic capacitance between the base and the collector of the transistor increases. For example, the parasitic capacitance between the third base and the third collector and the parasitic capacitance between the second base and the second collector of the second transistor Q2 may be made different from each other in accordance with the layout (including sizes and positions in a chip) of the third transistor Q3 and the second transistor Q2 in a GaAs IC chip described above.

For example, in the power amplifier circuit 10, the number of stages of amplifiers is not limited to two but may be three or more. For example, the power amplifier circuit 10 may further include an amplifier in a stage preceding to the first amplifier 1 including the first transistor Q1.

In the high frequency circuit 100, the filter 103 is an acoustic wave filter using surface acoustic waves. However, the filter 103 is not necessarily an acoustic wave filter using surface acoustic waves but may be an acoustic wave filter using, for example, boundary acoustic waves, plate waves, or the like.

In the acoustic wave filter, each of the plurality of series-arm resonators and the plurality of parallel-arm resonators is not necessarily a SAW resonator but may be, for example, a BAW (Bulk Acoustic Wave) resonator.

The high frequency circuit 100 may include a reception circuit that includes a low noise amplifier amplifying a reception signal input through the antenna terminal 105 and a filter connected to the low noise amplifier.

Furthermore, the filter 103 is not necessarily a transmission filter but may be a duplexer.

Furthermore, in the high frequency circuit 100, the first switch 102 and the second switch 104 may be, for example, switch ICs supporting GPIO (General Purpose Input/Output).

Aspects

Aspects described below are disclosed herein.

The power amplifier circuit (10) according to a first aspect amplifies a high frequency signal. The power amplifier circuit (10) includes the first transistor (Q1), the second transistor (Q2), the third transistor (Q3), the first bias circuit (4), the second bias circuit (5), the third bias circuit (6), the first current limiting circuit (7), and the second current limiting circuit (8). The first transistor (Q1) includes the first base, the first collector, and the first emitter. The second transistor (Q2) includes the second base, the second collector, and the second emitter. The second base of the second transistor (Q2) is connected to the first collector of the first transistor (Q1). The third transistor (Q3) includes the third base, the third collector, and the third emitter. The third base of the third transistor (Q3) is connected to the first collector of the first transistor (Q1), and the third collector of the third transistor (Q3) is connected to the second collector of the second transistor (Q2). The first bias circuit (4) includes the fourth transistor (40) connected to the first base. The second bias circuit (5) includes the fifth transistor (50) connected to the second base. The third bias circuit (6) includes the sixth transistor (60) connected to the third base. The fourth transistor (40) includes the fourth base, the fourth collector, and the fourth emitter. The fifth transistor (50) includes the fifth base, the fifth collector, and the fifth emitter. The sixth transistor (60) includes the sixth base, the sixth collector, and the sixth emitter. The first current limiting circuit (7) includes the seventh transistor (70), the first collector resistor (Rc1), and the first base resistor (Rb1). The seventh transistor (70) includes the seventh base, the seventh collector, and the seventh emitter. The seventh emitter of the seventh transistor (70) is connected to the fifth emitter. The first collector resistor (Rc1) includes the first end and the second end. The first end of the first collector resistor (Rc1) is connected to the seventh collector, and the second end of the first collector resistor (Rc1) is connected to the first collector. The first base resistor (Rb1) includes the first end and the second end. The first end of the first base resistor (Rb1) is connected to the seventh base, and the second end of the first base resistor (Rb1) is connected to the fifth base. The second current limiting circuit 8 includes the eighth transistor (80), the second collector resistor (Rc2), and the second base resistor (Rb2). The eighth transistor (80) includes the eighth base, the eighth collector, and the eighth emitter. The eighth emitter of the eighth transistor (80) is connected to the sixth emitter. The second collector resistor (Rc2) includes the first end and the second end. The first end of the second collector resistor (Rc2) is connected to the eighth collector, and the second end of the second collector resistor (Rc2) is connected to the first collector. The second base resistor (Rb2) includes the first end and the second end. The first end of the second base resistor (Rb2) is connected to the eighth base, and the second end of the second base resistor (Rb2) is connected to the sixth base. The power amplifier circuit (10) satisfies at least one of the first condition and the second condition. The first condition is that the resistance of the first base resistor (Rb1) is different from the resistance of the second base resistor (Rb2). The second condition is that the resistance of the first collector resistor (Rc1) is different from the resistance of the second collector resistor (Rc2).

In the power amplifier circuit (10) according to the first aspect, increase in power-added efficiency can be achieved.

The power amplifier circuit (10) according to a second aspect is based on the first aspect. In the first bias circuit (4), the fourth emitter is connected to the first base. In the second bias circuit (5), the fifth emitter is connected to the second base. In the third bias circuit (6), the sixth emitter is connected to the third base.

In the first or second aspect, the power amplifier circuit (10) according to a third aspect satisfies the first condition and the second condition.

In the power amplifier circuit (10) according to the third aspect, increase in the power-added efficiency can be achieved compared to the case where only one of the first condition and the second condition is satisfied.

In any one of the first to third aspects, the power amplifier circuit (10) according to a fourth aspect further includes the bypass circuit (170). The bypass circuit (170) is connected between the first base and the first collector of the first transistor (Q1). The bypass circuit (170) includes the series circuit including the bypass switch (SW1) and the capacitor (171).

In the power amplifier circuit (10) according to the fourth aspect, a high frequency signal can be amplified without necessarily operating the first transistor (Q1).

The power amplifier circuit (10) according to a fifth embodiment amplifies power of a high frequency signal. The power amplifier circuit (10) includes the first transistor (Q1), the second transistor (Q2), the third transistor (Q3), the first bias circuit (4), the second bias circuit (5), and the third bias circuit (6). The first transistor (Q1) includes the first base, the first collector, and the first emitter. The first transistor (Q1) amplifies a high frequency signal input through the first base and outputs the amplified high frequency signal through the first collector. The second transistor (Q2) includes the second base, the second collector, and the second emitter. The second base of the second transistor (Q2) is connected to the first collector of the first transistor (Q1). The third transistor (Q3) includes the third base, the third collector, and the third emitter. The third base of the third transistor (Q3) is connected to the first collector of the first transistor (Q1), and the third collector of the third transistor (Q3) is connected to the second collector of the second transistor (Q2). The first bias circuit (4) supplies the first bias current (I1) to the first base of the first transistor (Q1). The second bias circuit (5) supplies the second bias current (I2) to the second base of the second transistor (Q2). The third bias circuit (6) supplies the third bias current (I3) to the third base of the third transistor (Q3). In the power amplifier circuit (10), the gain dispersion (ΔGain) obtained in the case where the first bias current (I1) is supplied to the first transistor (Q1), the second bias current (I2) is not supplied to the second transistor (Q2), and the third bias current (I3) is supplied to the third transistor (Q3) is greater than the gain dispersion (ΔGain) obtained in the case where the first bias current (I1) is supplied to the first transistor (Q1), the second bias current (I2) is supplied to the second transistor (Q2), and the third bias current (I3) is supplied to the third transistor (Q3).

In the power amplifier circuit (10) according to the fifth aspect, increase in power-added efficiency can be achieved.

The high frequency circuit (100) according to a sixth aspect includes the power amplifier circuit (10) according to any one of the first to fifth aspects and the control circuit (110). The control circuit (110) controls the power amplifier circuit (10).

In the high frequency circuit (100) according to the sixth aspect, increase in power-added efficiency can be achieved.

In the sixth aspect, in the high frequency circuit (100) according to a seventh aspect, the power amplifier circuit (10) is capable of operating in a high output power mode and a medium output power mode with an output power lower than the high output power mode. In the case where the control circuit (110) causes the power amplifier circuit (10) to operate in the high output power mode, the control circuit (110) controls the first bias circuit (4), the second bias circuit (5), and the third bias circuit (6) to operate the first transistor (Q1), the second transistor (Q2), and the third transistor (Q3). In the case where the control circuit (110) causes the power amplifier circuit (10) to operate in the medium output power mode, the power amplifier circuit (10) controls the first bias circuit (4) and the third bias circuit (6) to operate the first transistor (Q1) and the third transistor (Q3).

The communication apparatus (300) according to an eighth aspect includes the high frequency circuit (100) according to the sixth or seventh aspect and the signal processing circuit (301). The power amplifier circuit (10) of the high frequency circuit (100) amplifies a high frequency signal input from the signal processing circuit (301).

In the communication apparatus (300) according to the eighth aspect, increase in the power-added efficiency of the power amplifier circuit (10) can be achieved.

REFERENCE SIGNS LIST 1 first amplifier
2 second amplifier
3 third amplifier
4 first bias circuit
40 fourth transistor
41 diode
42 diode
43 capacitor
44 resistor
5 second bias circuit
50 fifth transistor
51 diode
52 diode
53 capacitor
54 resistor
6 third bias circuit
60 sixth transistor
61 diode
62 diode
63 capacitor
64 resistor
7 first current limiting circuit
70 seventh transistor
8 second current limiting circuit
80 eighth transistor
10 power amplifier circuit
14 first constant current source
15 second constant current source
16 third constant current source
100 high frequency circuit
101 output matching circuit
102 first switch
103 filter
104 second switch
105 antenna terminal
111 first power supply terminal
112 second power supply terminal
130 first matching circuit
140 second matching circuit
150 third matching circuit
151 first resistor
152 second resistor
153 third resistor
161 first capacitor
162 second capacitor
163 third capacitor
170 bypass circuit
171 capacitor
300 communication apparatus
301 signal processing circuit
302 RF signal processing circuit
303 baseband signal processing circuit
304 switch
340 common terminal
341 first selection terminal
342 second selection terminal
310 antenna
321 ET modulator
322 constant voltage source
I1 first bias current
I2 second bias current
I3 third bias current
Rb1 first base resistor
Rb2 second base resistor
Rc1 first collector resistor
Rc2 second collector resistor
Q1 first transistor
Q2 second transistor
Q3 third transistor
SW1 bypass switch
Vcc1 power supply voltage
Vcc2 power supply voltage
ΔGain dispersion

The invention claimed is:

1. A power amplifier circuit configured to amplify power of a high frequency signal, comprising:
a first transistor that has a first base, a first collector, and a first emitter;
a second transistor that has a second base, a second collector, and a second emitter, the second base being connected to the first collector;
a third transistor that has a third base, a third collector, and a third emitter, the third base being connected to the first collector, the third collector being connected to the second collector;
a first bias circuit that comprises a fourth transistor connected to the first base;
a second bias circuit that comprises a fifth transistor connected to the second base;

a third bias circuit that comprises a sixth transistor connected to the third base;
a first current limiting circuit; and
a second current limiting circuit,
wherein the fourth transistor has a fourth base, a fourth collector, and a fourth emitter,
wherein the fifth transistor has a fifth base, a fifth collector, and a fifth emitter,
wherein the sixth transistor has a sixth base, a sixth collector, and a sixth emitter,
wherein the first current limiting circuit comprises:
  a seventh transistor having a seventh base, a seventh collector, and a seventh emitter, the seventh emitter being connected to the fifth emitter,
  a first collector resistor that has a first end and a second end, the first end being connected to the seventh collector, the second end being connected to the first collector, and
  a first base resistor that has a first end and a second end, the first end being connected to the seventh base, the second end being connected to the fifth base,
wherein the second current limiting circuit comprises:
  an eighth transistor that has an eighth base, an eighth collector, and an eighth emitter, the eight emitter being connected to the sixth emitter,
  a second collector resistor that has a first end and a second end, the first end being connected to the eighth collector, the second end being connected to the first collector, and
  a second base resistor that has a first end and a second end, the first end being connected to the eighth base, the second end being connected to the sixth base,
wherein a resistance of the first base resistor is different from a resistance of the second base resistor, or wherein a resistance of the first collector resistor is different from a resistance of the second collector resistor.

2. The power amplifier circuit according to claim 1,
wherein in the first bias circuit, the fourth emitter is connected to the first base,
wherein in the second bias circuit, the fifth emitter is connected to the second base, and
wherein in the third bias circuit, the sixth emitter is connected to the third base.

3. The power amplifier circuit according to claim 1, wherein the resistance of the first base resistor is different from the resistance of the second base resistor and wherein the resistance of the first collector resistor is different from the resistance of the second collector resistor.

4. The power amplifier circuit according to claim 1, further comprising:
a bypass circuit that is connected between the first base and the first collector of the first transistor,
wherein the bypass circuit comprises a bypass switch and a capacitor connected in series with each other.

5. A power amplifier circuit configured to amplify power of a high frequency signal, comprising:
a first transistor that has a first base, a first collector, and a first emitter, the first transistor being configured to amplify the high frequency signal input through the first base and to output an amplified high frequency signal through the first collector;
a second transistor that has a second base, a second collector, and a second emitter, the second base being connected to the first collector;
a third transistor that has a third base, a third collector, and a third emitter, the third base being connected to the first collector, the third collector being connected to the second collector;
a first bias circuit configured to supply a first bias current to the first base of the first transistor;
a second bias circuit configured to supply a second bias current to the second base of the second transistor; and
a third bias circuit configured to supply a third bias current to the third base of the third transistor,
wherein a gain dispersion of the power amplifier circuit is greater when the first bias current is supplied to the first transistor, the second bias current is not supplied to the second transistor, and the third bias current is supplied to the third transistor than when the first bias current is supplied to the first transistor, the second bias current is supplied to the second transistor, and the third bias current is supplied to the third transistor.

6. A high frequency circuit comprising:
the power amplifier circuit according to claim 1; and
a control circuit configured to control the power amplifier circuit.

7. A high frequency circuit comprising:
the power amplifier circuit according to claim 5; and
a control circuit configured to control the power amplifier circuit.

8. The high frequency circuit according to claim 6,
wherein the power amplifier circuit is configured to operate in a high output power mode and a medium output power mode, an output power being lower in the medium output power mode than in the high output power mode,
wherein when the control circuit causes the power amplifier circuit to operate in the high output power mode, the control circuit is configured to control the first bias circuit, the second bias circuit, and the third bias circuit to operate the first transistor, the second transistor, and the third transistor, and
wherein when the control circuit causes the power amplifier circuit to operate in the medium output power mode, the control circuit is configured to control the first bias circuit and the third bias circuit to operate the first transistor and the third transistor.

9. The high frequency circuit according to claim 7,
wherein the power amplifier circuit is configured to operate in a high output power mode and a medium output power mode, an output power being lower in the medium output power mode than in the high output power mode,
wherein when the control circuit causes the power amplifier circuit to operate in the high output power mode, the control circuit is configured to control the first bias circuit, the second bias circuit, and the third bias circuit to operate the first transistor, the second transistor, and the third transistor, and
wherein when the control circuit causes the power amplifier circuit to operate in the medium output power mode, the control circuit is configured to control the first bias circuit and the third bias circuit to operate the first transistor and the third transistor.

10. A communication apparatus comprising:
the high frequency circuit according to claim 6; and
a signal processing circuit,
wherein the power amplifier circuit of the high frequency circuit is configured to amplify the high frequency signal input from the signal processing circuit.

11. A communication apparatus comprising:
the high frequency circuit according to claim 7; and
a signal processing circuit,
wherein the power amplifier circuit of the high frequency circuit is configured to amplify the high frequency signal input from the signal processing circuit.

* * * * *